(12) United States Patent
Shen et al.

(10) Patent No.: US 11,264,504 B2
(45) Date of Patent: Mar. 1, 2022

(54) ACTIVE AND DUMMY FIN STRUCTURES

(71) Applicant: GLOBALFOUNDRIES U.S. INC., Santa Clara, CA (US)

(72) Inventors: Yanping Shen, Saratoga Springs, NY (US); Haiting Wang, Clifton Park, NY (US); Hong Yu, Rexford, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 30 days.

(21) Appl. No.: 16/751,779

(22) Filed: Jan. 24, 2020

(65) Prior Publication Data

US 2021/0234034 A1 Jul. 29, 2021

(51) Int. Cl.
*H01L 29/78* (2006.01)
*H01L 29/16* (2006.01)
*H01L 29/423* (2006.01)

(52) U.S. Cl.
CPC ............ *H01L 29/785* (2013.01); *H01L 29/16* (2013.01); *H01L 29/4236* (2013.01)

(58) Field of Classification Search
CPC ....... H01L 29/16; H01L 29/42; H01L 29/423; H01L 29/4236; H01L 29/78; H01L 29/785

USPC .......................................... 257/401
See application file for complete search history.

(56) References Cited

U.S. PATENT DOCUMENTS

| | | | |
|---|---|---|---|
| 8,697,515 B2 * | 4/2014 | Yin | ................. H01L 21/823431 438/239 |
| 8,881,066 B2 | 11/2014 | Shieh et al. | |
| 8,987,836 B2 | 3/2015 | Kim et al. | |
| 9,236,267 B2 | 1/2016 | De et al. | |

* cited by examiner

*Primary Examiner* — Monica D Harrison
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a scheme of active and dummy fin structures and methods of manufacture. The structure includes: an active fin structure; at least one dummy fin structure running along at least one side of the active fin structure along its length; a fin cut separating the at least one dummy fin structure along its longitudinal axes; and a gate structure extending over the active fin structure and the fin cut.

20 Claims, 5 Drawing Sheets

ACTIVE AND DUMMY FIN STRUCTURES

FIELD OF THE INVENTION

The present disclosure relates to semiconductor structures and, more particularly, to a scheme of active and dummy fin structures and methods of manufacture.

BACKGROUND

A fin field-effect transistor (FinFET) is a multi-gate device built on a substrate. FinFET devices have significantly faster switching times and higher current density than planar complementary metal-oxide-semiconductor technology. Single fin active FinFET devices can be used for low power consumption applications, but they suffer crystal defects which induce high leakage issues and significant yield loss and malfunction.

The crystal defects are caused by stress imposed by, e.g., flowable chemical vapor deposition (FCVD), particularly during formation of shallow trench isolation structures. More specifically, FCVD undergoes densification and contracts upon thermal anneals, which can pull apart the fin structures. For example, steam oxidation and post dry anneal can result in a volume contraction or shrinkage of about 16% to 17%. This contraction results in a stress, e.g., a cause for bending or deflection of the active fin structure, resulting in crystal defects. The crystal defects, in turn, result in high Iddq.

SUMMARY

In an aspect of the disclosure, a structure comprises: an active fin structure; at least one dummy fin structure running along at least one side of the active fin structure along its length; a fin cut separating the at least one dummy fin structure along its longitudinal axes; and a gate structure extending over the active fin structure and the fin cut.

In an aspect of the disclosure, a structure comprising: an active fin structure; at least two separate dummy fin structures each comprising a diffusion break, a first of the at least two dummy fin structures located on a first lengthwise side of the active fin structure and a second of the at least two dummy fin structures located on a second lengthwise side of the active fin structure; isolation material between the active fin structure and the at least two separate dummy fin structures; and a gate structure extending over the active fin structure and within the diffusion break of the of the at least two dummy fin structures.

In an aspect of the disclosure, a structure comprises: an active fin structure between opposing single diffusion breaks in dummy fin structures; and a gate structure over the active fin structure and the opposing single diffusion breaks.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a scheme of active and dummy fin structures and methods of manufacture. More specifically, the present disclosure provides one or more dummy fin structures adjacent to an active fin structure to reduce stresses which otherwise would be imposed on the active fin structure. Advantageously, by implementing the scheme described herein, it is now possible to eliminate crystal defects in the active fin structure which, in turn, eliminates leakage issues due to stresses imposed on the active fin structure, while also significantly increasing yield and functionality of a finFET.

In embodiments, the present disclosure provides a single-fin application for a low power consumption application. The single-fin application includes an active fin device free of crystal defects while not changing the overall footprint compared to known design schemes. In embodiments, the single-fin application includes one or more dummy fin structures sitting beside a, active fin device, which eliminates stresses imposed on the active fin structure. The dummy fin structures include a cut under the gate structure to enlarge middle of the line (MOL) process window.

The scheme of active and dummy fin structures of the present disclosure can be manufactured in a number of ways using a number of different tools. In general, though, the methodologies and tools are used to form structures with dimensions in the micrometer and nanometer scale. The methodologies, i.e., technologies, employed to manufacture the scheme of active and dummy fin structures of the present disclosure have been adopted from integrated circuit (IC) technology. For example, the structures are built on wafers and are realized in films of material patterned by photolithographic processes on the top of a wafer. In particular, the fabrication of the scheme of active and dummy fin structures uses three basic building blocks: (i) deposition of thin films of material on a substrate, (ii) applying a patterned mask on top of the films by photolithographic imaging, and (iii) etching the films selectively to the mask.

Figure 1A:
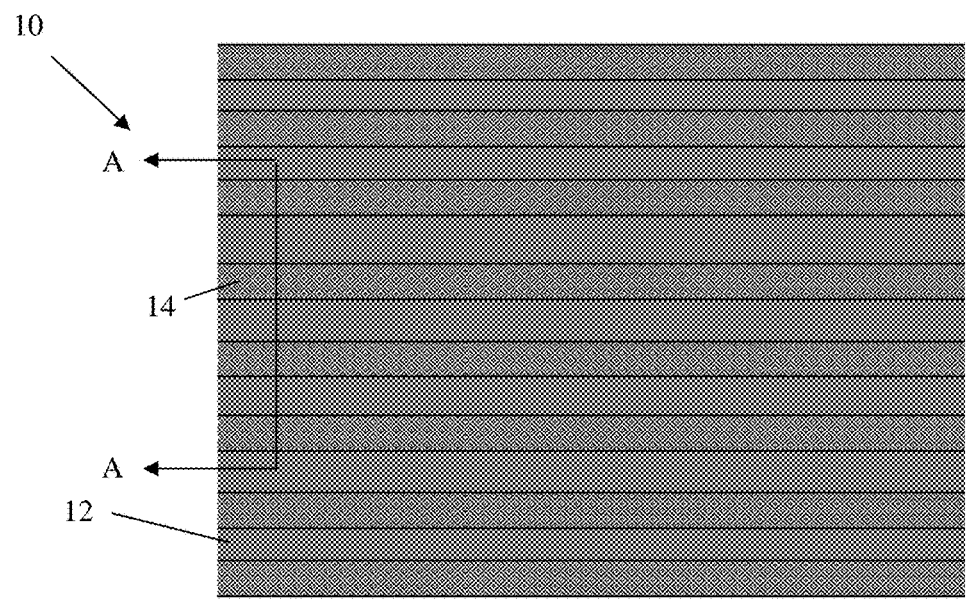
FIG. 1A shows a plan view of a plurality of fin structures, amongst other features, and related fabrication processes in accordance with aspects of the present disclosure.
Figure 1B:
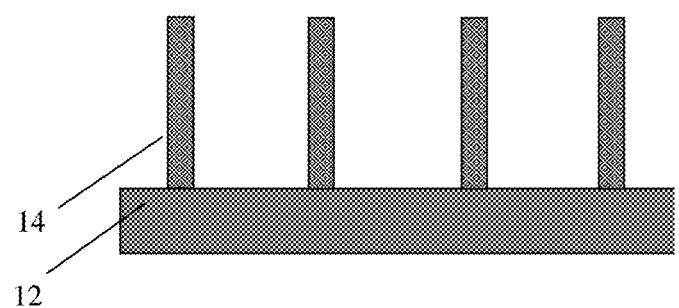
FIG. 1B shows a cross-sectional view of FIG. 1A along line A-A.

FIG. 1A shows a plan view of a plurality of fin structures, amongst other features, and related fabrication processes in accordance with aspects of the present disclosure. FIG. 1B shows a cross-sectional view of FIG. 1A along line A-A. More specifically and referring to FIGS. 1A and 1B, the structure 10 includes a plurality of fin structures 14 formed on a substrate 12. In embodiments, the substrate 12 can be composed of either bulk materials or semiconductor on insulator (SOI) technologies. For example, the substrate 12 may be composed of any suitable material including, but not limited to, Si, SiGe, SiGeC, SiC, GaAs, InAs, InP, and other III/V or II/VI compound semiconductors.

In the SOI technologies, the substrate 12 includes an insulator layer on top of a semiconductor wafer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. A semiconductor material is formed on top of the insulator layer to form a semiconductor-on-insulator (SOI) substrate, which can be fabricated using wafer bonding, and/or other suitable methods. The substrate 12 may comprise any suitable crystallographic orientation (e.g., a (100), (110), (111), or (001) crystallographic orientation), and can be composed of any of the materials described herein.

Still referring to FIGS. 1A and 1B, the fin structures 14 can be fabricated using conventional lithography and etching techniques including sidewall image transfer (SIT) or self-aligned double patterning (SADP). In the SIT technique, for example, a mandrel is formed on the substrate 12 using conventional CVD processes. A resist is formed on the mandrel material, and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 14, for example. The mandrels are removed or stripped using a conventional etching process, selective to the mandrel material. An etching of the substrate material is then performed within the spacing of the spacers to form the sub-lithographic features, e.g., fin structures 14. The sidewall spacers can then be stripped.

Figure 2A:
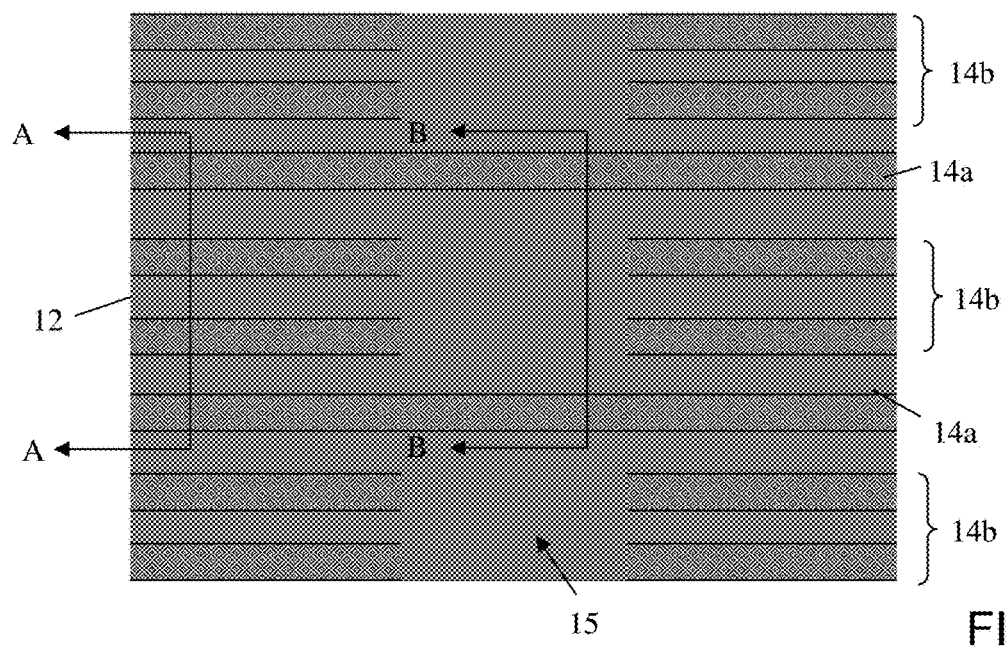
FIG. 2A shows a plan view of a fin cut, amongst other features, and related fabrication processes in accordance with aspects of the present disclosure.
Figure 2B:
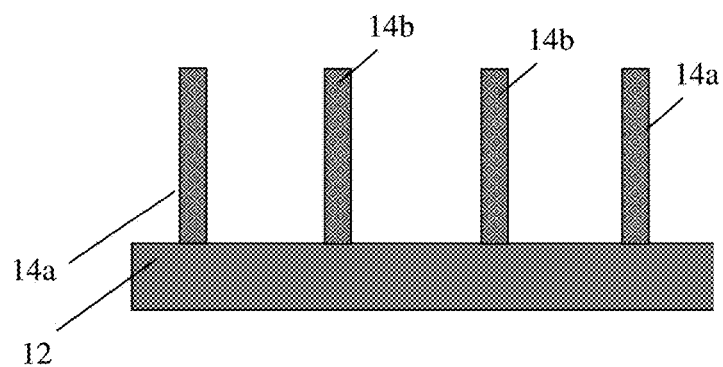
FIG. 2B shows a cross-sectional view of FIG. 2A along line A-A.
Figure 2C:
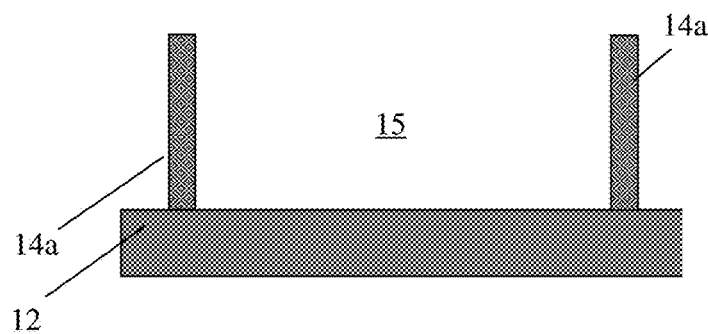
FIG. 2C shows a cross-sectional view of FIG. 2A along line B-B.

FIG. 2A shows a plan view of a fin cut, amongst other features, and related fabrication processes in accordance with aspects of the present disclosure. FIG. 2B shows a cross-sectional view of FIG. 2A along line A-A; whereas, FIG. 2C shows a cross-sectional view of FIG. 2A along line B-B. More specifically, FIGS. 2A-2C show a fin cut 15 in fin structures 14b, along their longitudinal extent. In embodiments, the fin cut 15 is a single diffusion break for each fin structure 14b, on both sides of the fin structure 14a. The fin structures 14b are preferably two dummy fin structures on each side (e.g., adjacent and besides) of one (e.g., single) active fin structure 14a. As discussed in more detail below, a gate structure will span over the fin structure 14a, hence becoming an active fin structure 14a. Due to the placement of the dummy fin structures 14b adjacent to the active fin structures 14a, stresses caused by the deposition of insulator material, e.g., formation of shallow trench isolation structures, will be eliminated on the active fin structure 14a, thereby eliminating crystal defects on the active fin structures 14a and, hence eliminating leakage issues resulting from such crystal defects.

The fin cut 15 will be located under a yet to be processed (formed) metal gate structures, to thereby enlarge a middle of the line process window. Accordingly and as shown in FIGS. 2A-2C, the fin cut 15 effectively separates the dummy fin structures 14b along their longitudinal axes, while maintaining the integrity of the fin structures 14a. In embodiments, the fin cut 15 of the dummy fin structures 14b is provided by a partial etching of the dummy fin structures 14b along their longitudinal axes, using conventional lithography and etching processes known to those of ordinary skill in the art such that no further description is required for a complete understanding of the present disclosure.

Figure 3A:
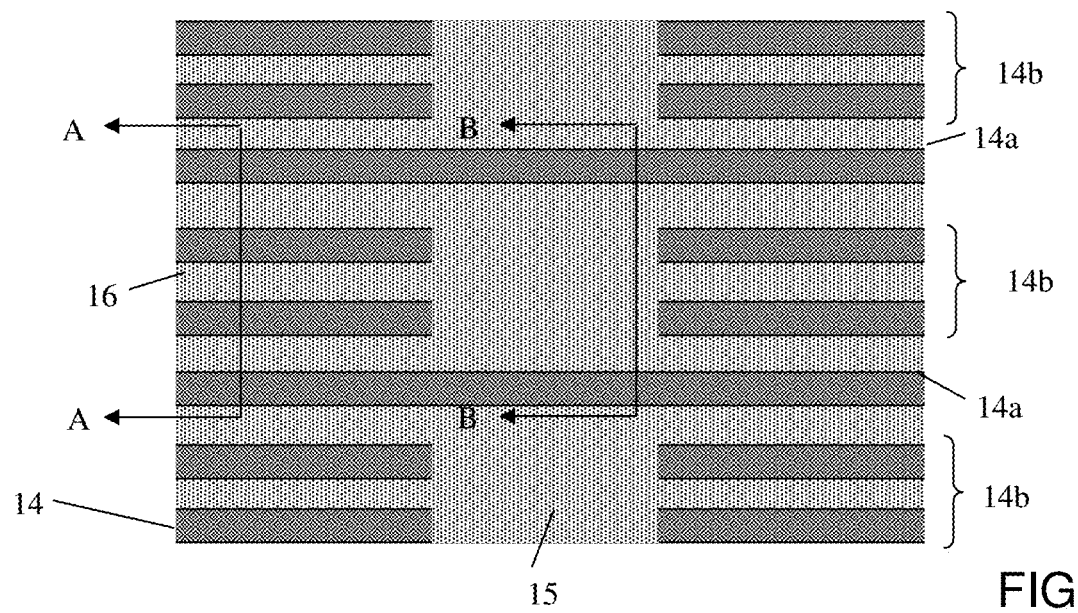
FIG. 3A shows recessed isolation material in the fin cut and between the fin structures, amongst other features, and related fabrication processes in accordance with aspects of the present disclosure.
Figure 3B:
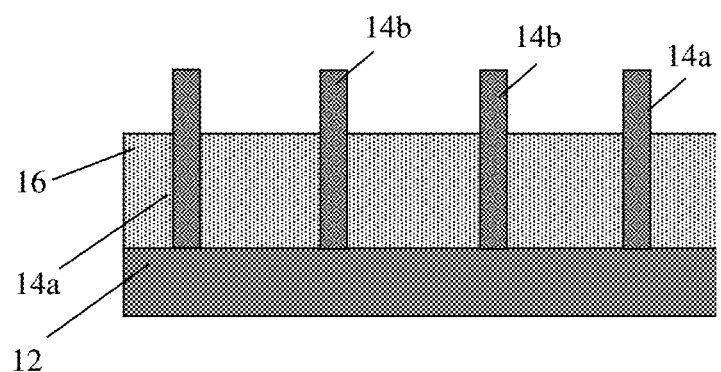
FIG. 3B shows a cross-sectional view of FIG. 3A along line A-A.
Figure 3C:
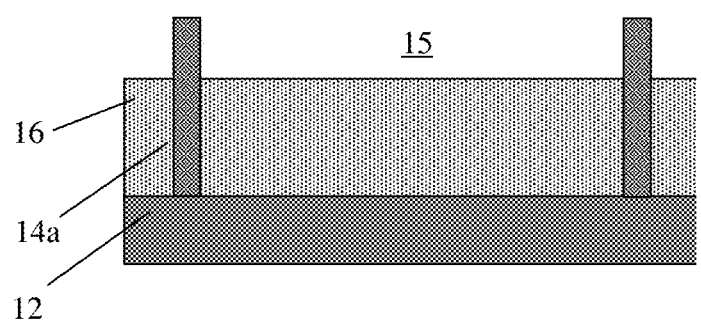
FIG. 3C shows a cross-sectional view of FIG. 3A along line B-B.

FIG. 3A shows recessed isolation material in the fin cut 15 and between the fin structures 14a, 14b, amongst other features. FIG. 3B shows a cross-sectional view of FIG. 3A along line A-A; whereas, FIG. 3C shows a cross-sectional view of FIG. 3A along line B-B. Referring to FIGS. 3A-3C, isolation material 16 is deposited within the fin cut 15 and between the fin structures 14a, 14b. In embodiments, the isolation material can be an oxide material deposited by a conventional flowable chemical vapor deposition (FCVD) process followed by a chemical mechanical planarization (CMP) process. Advantageously, as noted herein, due to location of the dummy fin structures 14b remaining adjacent to an active fin structures 14a, stresses and resultant crystal defects caused by the deposition of the insulator material 16 will be eliminated in the active fin structures 14a.

Following the CMP process, the isolation material 16 is recessed to reveal the fin structures 14a, 14b, i.e., using a fin reveal process. In embodiments, the fin reveal process can be a conventional etching process to lower a height of the isolation material to below a top surface of the fin structures 14a, 14b, thereby forming shallow trench isolation regions within the fin cut 15 and between the adjacent fin structures 14a, 14b along their lengths.

Figure 4A:
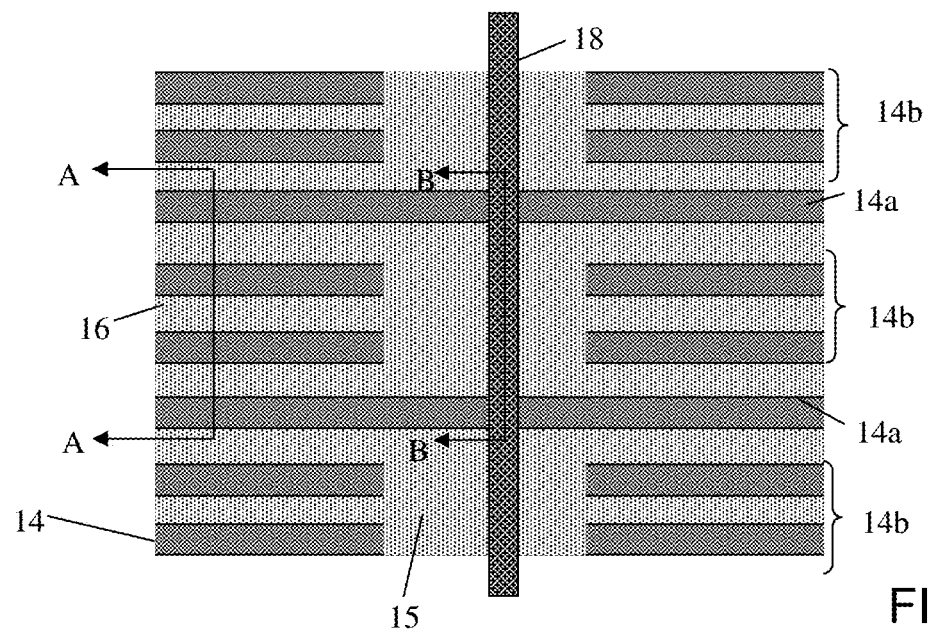
FIG. 4A shows a dummy gate structure extending over the fin cut and active fin structures, amongst other features, and related fabrication processes in accordance with aspects of the present disclosure.
Figure 4B:
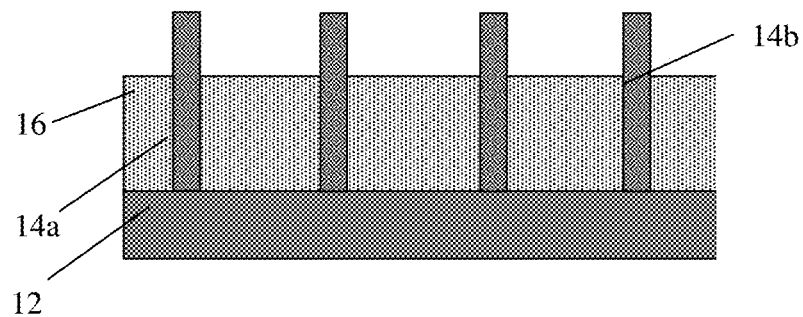
FIG. 4B shows a cross-sectional view of FIG. 4A along line A-A.
Figure 4C:
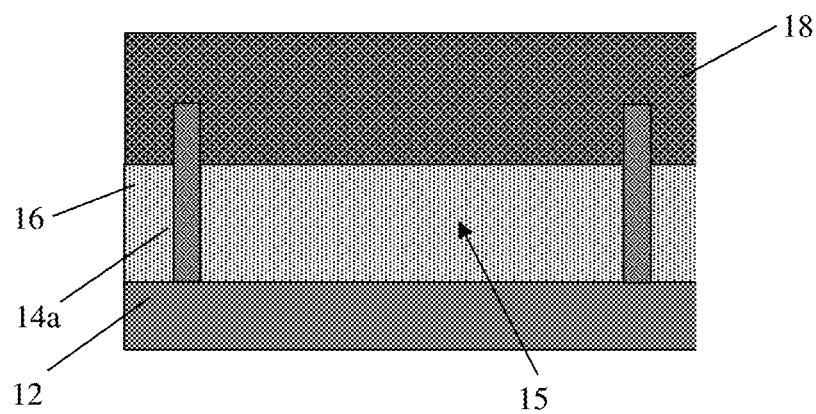
FIG. 4C shows a cross-sectional view of FIG. 4A along line B-B.

FIG. 4A shows a dummy gate structure 18 extending within the fin cut 15 and over the active fin structures 14a, amongst other features. FIG. 4B shows a cross-sectional view of FIG. 4A along line A-A; whereas, FIG. 4C shows a cross-sectional view of FIG. 4A along line B-B. In embodiments, the dummy gate structure 18 can be fabricated using conventional deposition, lithography and etching process as is known in the art. By way of illustrative example, a gate dielectric material can be deposited over the fin structures 14a, 14b, and within the fin cut 15 (between dummy gate structures 14a) over the isolation material 16. The gate dielectric material can be a high-k gate dielectric material, e.g., $HfO_2Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. A dummy gate material, e.g., polysilicon, is deposited on the gate dielectric material. The gate dielectric material and the dummy gate material are then patterned to form the dummy gate structure 18 extending over the fin cut 15 and the active fin structures 14a (which now have dummy gate structures 14a at their sides). Sidewalls can be formed on the dummy gate structure 18 by deposition of sidewall material, e.g., nitride, and anisotropic etching processes as is known in the art.

Figure 5A:
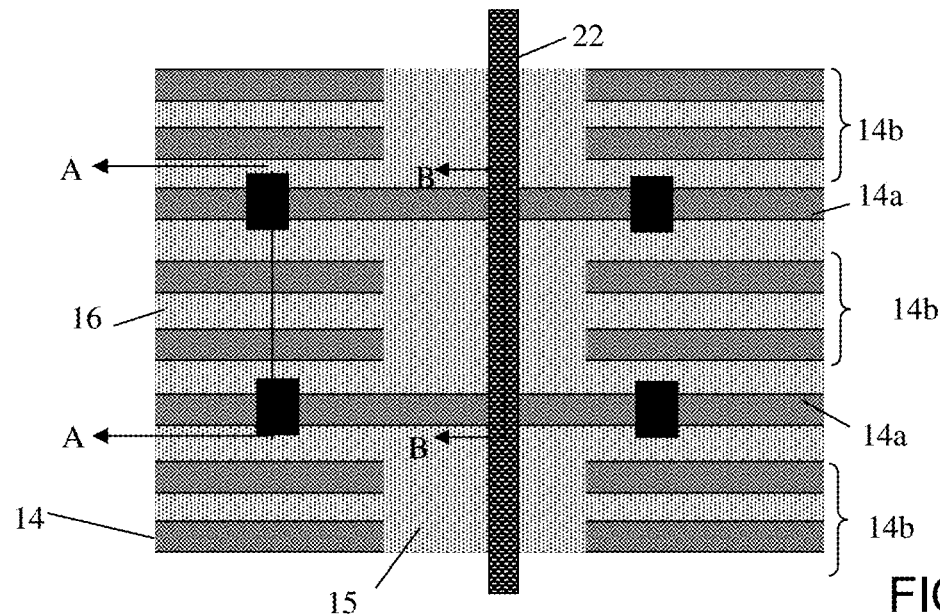
FIG. 5A shows replacement gate structures with source and drain regions, amongst other features, and related fabrication processes in accordance with aspects of the present disclosure.
Figure 5B:
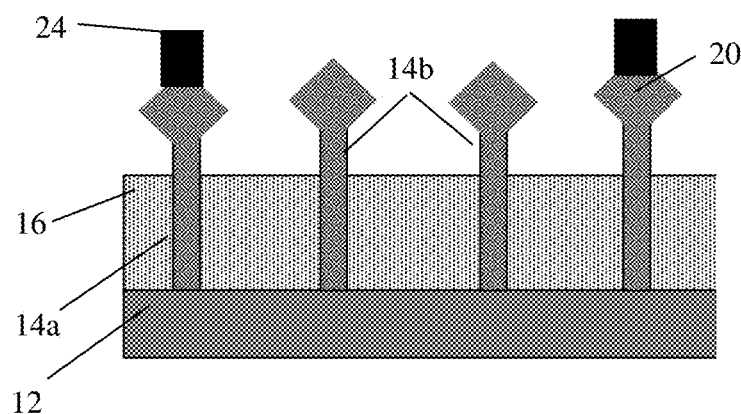
FIG. 5B shows a cross-sectional view of FIG. 5A along line A-A.
Figure 5C:
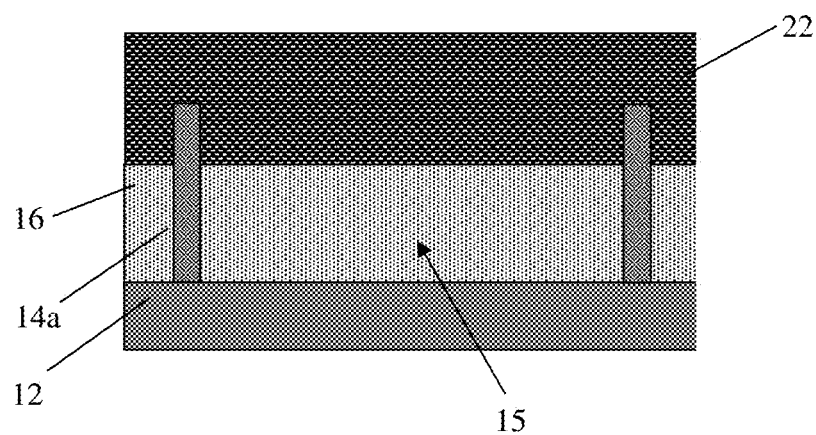
FIG. 5C shows a cross-sectional view of FIG. 5A along line B-B.

Referring to FIGS. 5A-5C, epitaxial growths 20 are formed on the exposed fin structures 14a, 14b. In embodiments, the epitaxial growths 20 can be doped raised source and drain regions composed of semiconductor material. In addition, the dummy gate material (polysilicon) of the dummy gate structure is removed by conventional etching processes, and replaced with replacement metal gate material 22, e.g., workfunction materials, between the sidewalls. In this way, the replacement metal gate material (e.g., replacement metal gate) will span over the fin structure 14a and between the fin structures 14b. Accordingly, the fin structure 14a is an active fin structure and the fin structures 14b are dummy fin structures, which will reduce stress imposed on the active fin structure 14a.

In embodiments, examples of the workfunction materials for a p-channel FET include Ti, TiAlC, Al, TiAl, TaN, TaAlC, TiN, TiC and Co. In one embodiment, TiN is used for a p-channel FET. Examples of the workfunction materials for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. The workfunction materials may be formed by chemical vapor deposition (CVD), physical vapor deposition (PVD) including sputtering, atomic layer deposition (ALD) or other suitable method.

Silicide contacts 24 are formed on the raised source and drain regions 20. In embodiments, the silicide contacts 24 are aligned with the dummy fin structures 14b. In other words, the silicide contacts 24 are provided on the active fin structure 14a, adjacent a side of the dummy fin structures 14b.

As should be understood by those of skill in the art, the silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source and drain regions) forming a low-resistance transition metal silicide. Following the reaction, any remaining transition metal is removed by chemical etching, leaving silicide contacts 24 in the active regions of the device.

The scheme of active and dummy fin structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
an active fin structure;
at least one dummy fin structure running along at least one side of the active fin structure along its length;
a fin cut separating the at least one dummy fin structure along its longitudinal axes into axially aligned opposing dummy fin structures; and
a gate structure extending over the active fin structure and the fin cut between respective opposing ends of the axially aligned opposing dummy fin structures.

2. The structure of claim 1, wherein the gate structure is a metal replacement gate structure and which does not extend over the at least one dummy fin structure.

3. The structure of claim 1, wherein the at least one dummy fin structure is at least two dummy fin structures, each of which run along one opposing side of the active fin structure along its length.

4. The structure of claim 3, wherein the active fin structure extends alongside of the fin cut separating the at least one dummy fin structure along its longitudinal axes.

5. The structure of claim 3, further comprising isolation material within the fin cut and between the two dummy fin structures and the active fin structure.

6. The structure of claim 5, wherein the isolation material is shallow trench isolation structures.

7. The structure of claim 5, wherein the isolation material is recessed to below a surface the two dummy fin structures and the active fin structure.

8. The structure of claim 5, wherein the active fin structure is Si material.

9. The structure of claim 8, wherein the active fin structure is devoid of crystal defects.

10. The structure of claim 5, further comprising epitaxial growths on the active fin structure and the two dummy fin structures.

11. The structure of claim 10, further comprising silicided contacts on the epitaxial growths of the active fin structure.

12. A structure comprising:
an active fin structure;
at least two separate dummy fin structures each comprising a diffusion break at an end portion thereof, a first of the at least two dummy fin structures located on a first lengthwise side of the active fin structure and a second of the at least two dummy fin structures located on a second lengthwise side of the active fin structure;
isolation material between the active fin structure and the at least two separate dummy fin structures; and a gate structure extending over the active fin structure and within the diffusion break of the at least two dummy fin structures.

13. The structure of claim 12, further comprising contacts on the active fin structure.

14. The structure of claim 13, wherein the contacts align with the at least two separate dummy fin structures.

15. The structure of claim 14, wherein the gate structure is a replacement metal gate structure which is over the isolation material within the diffusion break of each of the at least two dummy fin structures, and which does not extend over the at least two dummy fin structures.

16. The structure of claim 15, further comprising at least two additional dummy fin structures each comprising a diffusion break at an end portion thereof, wherein
   a first of the at least two additional dummy fin structures is located on the first lengthwise side of the active fin structure;
   a second of the at least two additional dummy fin structures is located on a second lengthwise side of the active fin structure; and
   the diffusion break comprises:
      a first diffusion break extends between ends of the first of the at least two dummy fin structures and the at least two additional dummy fin structures; and
      a second diffusion break extend between ends of the second of the at least two dummy fin structures and the at least two additional dummy fin structures; and
   the gate structure extends within the first diffusion break and the second diffusion break between the ends of the first and second of the at least two dummy fin structures and the at least two additional dummy fin structures, and wherein the active fin structure extends between and alongside of the first diffusion break and the second diffusion break.

17. The structure of claim 15, wherein the isolation material is shallow trench isolation structures recessed below a surface the at least two separate dummy fin structures.

18. The structure of claim 15, wherein the active fin structure is Si material devoid of crystal defects.

19. A structure, comprising:
   an active fin structure between opposing single diffusion breaks located between ends of dummy fin structures that are in axial alignment within one another; and
   a gate structure over the active fin structure, between the ends of the dummy fin structures and within the opposing single diffusion breaks.

20. The structure of claim 19, further comprising shallow isolation structures within spaces between the active fin, the diffusion breaks and the dummy fin structures, wherein the active fin is between the dummy fin structures, along its length, and the gate structure is a replacement metal gate structure and, wherein
   the active fin structure is located between and is parallel to the dummy fin structures, and
   the dummy fin structures are cut along their length such that the opposing single diffusion breaks are between the ends of two of the dummy fin structures that are in axial alignment to one another, on each side of the active fin structure, and
   the gate structure does not extend over the dummy fin structures.

* * * * *